United States Patent
Yagi et al.

(10) Patent No.: US 9,240,439 B2
(45) Date of Patent: Jan. 19, 2016

(54) SEMICONDUCTOR DEVICE AND METHOD FOR MANUFACTURING SEMICONDUCTOR DEVICE

(71) Applicant: ROHM CO., LTD., Kyoto (JP)

(72) Inventors: Ryoutaro Yagi, Kyoto (JP); Satoshi Kageyama, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/560,745

(22) Filed: Dec. 4, 2014

(65) Prior Publication Data

US 2015/0162396 A1    Jun. 11, 2015

(30) Foreign Application Priority Data

Dec. 10, 2013    (JP) .................. 2013-255344

(51) Int. Cl.
*H01L 27/01* (2006.01)
*H01L 49/02* (2006.01)
*H01L 21/308* (2006.01)

(52) U.S. Cl.
CPC ............ *H01L 28/20* (2013.01); *H01L 21/3081* (2013.01); *H01L 27/016* (2013.01); *H01L 28/60* (2013.01)

(58) Field of Classification Search
CPC .... H01L 21/3081; H01L 27/016; H01L 28/20
See application file for complete search history.

(56) References Cited

U.S. PATENT DOCUMENTS

| 7,403,094 | B2 * | 7/2008 | Beach et al. | 338/309 |
|---|---|---|---|---|
| 7,633,373 | B1 * | 12/2009 | Johnson et al. | 338/195 |
| 8,445,353 | B1 * | 5/2013 | Raghavan et al. | 438/381 |
| 8,531,003 | B2 * | 9/2013 | Lee | 257/536 |
| 8,642,438 | B2 * | 2/2014 | Lee et al. | 438/382 |
| 8,766,405 | B2 * | 7/2014 | Kim | 257/536 |
| 2013/0093055 | A1 * | 4/2013 | Lee | 257/536 |
| 2013/0093056 | A1 * | 4/2013 | Kim | 257/536 |

FOREIGN PATENT DOCUMENTS

JP    2011-258861 A    12/2011

* cited by examiner

*Primary Examiner* — Allan R Wilson
(74) *Attorney, Agent, or Firm* — Rabin & Berdo, P.C.

(57) ABSTRACT

A semiconductor device includes a first etching stopper film and a second etching stopper film that are formed to be spaced apart from one another on a first inter-layer insulating film; a metal thin film resistor formed to extend over the first and second etching stopper films; a second inter-layer insulating film formed on the first inter-layer insulating film to cover the first and second etching stopper films and the metal thin film resistor; a first contact hole formed in the second inter-layer insulating film to extend from a surface of the second inter-layer insulating film onto the first etching stopper film by penetrating through the metal thin film resistor; and a second contact hole formed in the second inter-layer insulating film to extend from a surface of the second inter-layer insulating film onto the second etching stopper film by penetrating through the metal thin film resistor.

11 Claims, 10 Drawing Sheets

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2013-255344, filed on Dec. 10, 2013, the entire contents of which are incorporated herein by reference.

TECHNICAL FIELD

The present disclosure relates to a semiconductor device having a metal thin film resistor and a method for manufacturing such a semiconductor.

BACKGROUND

A metal thin film resistor is very thin, and thus, when a contact hole is formed directly on the metal thin film resistor, the contact hole may penetrate through the metal thin film resistor to connect the metal thin film resistor to a wiring positioned below the metal thin film resistor.

Conventionally, to prevent a metal thin film resistor from being connected to a wiring positioned below the metal thin film resistor, the following semiconductor device has been known. To be specific, this conventional semiconductor device includes a metal thin film resistor formed on an inter-layer insulating film, two conductive etching stopper films having conductivity and formed to be spaced apart from one another on a surface of the metal thin film resistor, an insulating layer formed on the inter-layer insulating film to cover the metal thin film resistor and the etching stopper films, and two contact holes extending from a surface of the insulating film to the etching stopper films, respectively. In such a conventional semiconductor device, since the conductive etching stopper films are formed on the metal thin film resistor, the contact holes can be prevented from penetrating the metal thin film resistor. Accordingly, the metal thin film resistor can be prevented from connecting to a wiring positioned below the metal thin film resistor.

The above conventional semiconductor device can be manufactured, for example, as follows. Initially, a thin film resistor layer of a material for a metal thin film resistor is formed on an inter-layer insulating film. A first insulating film is then formed on the thin film resistor layer. Subsequently, two thin contact holes are formed to be spaced apart from one another in the first insulating film, extending from a surface of the first insulating film onto a surface of the thin film resistor layer. Thereafter, a conductor layer of a material for etching stopper films is formed on the surfaces of the thin film resistor layer and the first insulating film. Accordingly, the conductor layer connected to the thin film resistor layer is buried in the two thin contact holes. Then, the thin film resistor layer, the first insulating film, and the conductor layer are etched to be patterned such that the thin film resistor layer remains only in a required location. Thereafter, the conductor layer on the thin film resistance layer (i.e., metal thin film resistor) is divided into two parts through the etching such that it includes conductor layers buried in the different thin contact holes, respectively. Accordingly, two etching stopper films are formed in positions spaced apart from one another on the surface of the metal thin film resistor. Thereafter, a second insulating film is formed on the inter-layer insulating film to cover the surfaces of the metal thin film resistor, the first insulating film, and the conductor layer. And then, two deep contact holes extending from the surface of the second insulating film onto each of the etching stopper films are formed in the second insulating film.

This manufacturing method, however, takes time because of the large number of processes. Further, masks are required in four processes of forming the thin contact holes, etching the thin film resistor layer, separating the conductor layer into two parts, and forming the deep contact holes, which results in an increase in cost for manufacturing the masks.

SUMMARY

The present disclosure provides some embodiments of a semiconductor device and a method for manufacturing a semiconductor device, which are capable of preventing a metal thin film resistor from being connected to a wiring positioned below the metal thin film resistor, further shortening manufacturing time and reducing costs for manufacturing masks.

According to one embodiment of the present disclosure, provided is a semiconductor device, including a first etching stopper film and a second etching stopper film that are conductive and formed to be spaced apart from one another on a first inter-layer insulating film; a metal thin film resistor formed to extend over the first etching stopper film and the second etching stopper film on the first inter-layer insulating film; a second inter-layer insulating film formed on the first inter-layer insulating film to cover the first and second etching stopper films and the metal thin film resistor; a first contact hole formed in the second inter-layer insulating film to extend from a surface of the second inter-layer insulating film onto the first etching stopper film by penetrating through the metal thin film resistor; and a second contact hole formed in the second inter-layer insulating film to extend from a surface of the second inter-layer insulating film onto the second etching stopper film by penetrating through the metal thin film resistor.

In the above configuration, an etching stopper film is interposed between a part of the metal thin film resistor in which the contact hole is formed and the first inter-layer insulating film. Thus, when first and second contact holes are formed in the second inter-layer insulating film to extend from a surface of the second inter-layer insulating film onto the first and second etching stopper film by penetrating through the metal thin film resistor, the first and second contact holes can be prevented from reaching the first inter-layer insulating film. Accordingly, the metal thin film resistor can be prevented from being connected to a wiring positioned below the metal thin film resistor.

In one embodiment of the present disclosure, the metal thin film resistor may include a first portion configured to cover an entire region of outer surfaces of the first etching stopper film, except for a connection portion with the first contact hole, and a surrounding region of the first etching stopper film on the surface of the first inter-layer insulating film; a second portion configured to cover an entire region of outer surfaces of the second etching stopper film, except for a connection portion with the second contact hole, and a surrounding region of the second etching stopper film on the surface of the first inter-layer insulating film; and a third portion configured to connect the first portion and the second portion.

In one embodiment of the present disclosure, the outer surfaces of the first etching stopper film may include side surfaces and an upper surface of the first etching stopper film, and the outer surfaces of the second etching stopper film may include side surfaces and an upper surface of the second etching stopper film.

In one embodiment of the present disclosure, the semiconductor device may further include a first contact plug formed in the first contact hole and connected to the first etching stopper film; and a second contact plug formed in the second contact hole and connected to the second etching stopper film.

In one embodiment of the present disclosure, the metal thin film resistor may be formed of TaN or SiCr.

In one embodiment of the present disclosure, the first etching stopper film and the second etching stopper film may be formed of TiN.

In one embodiment of the present disclosure, a thickness of the metal thin film resistor may range from 2 nm to 10 nm.

In one embodiment of the present disclosure, a thickness of each of the first etching stopper film and the second etching stopper film may range from 10 nm to 80 nm.

In one embodiment of the present disclosure, the semiconductor device may further include a capacitor including a lower electrode formed on a third inter-layer insulating film disposed below the first inter-layer insulating film, and an upper electrode formed on the first inter-layer insulating film to face the lower electrode. In this embodiment, the upper electrode may be formed in a process for forming the first and second etching stopper films.

According to another embodiment of the present disclosure, provided is a method of manufacturing a semiconductor device, including forming a first etching stopper film and a second etching stopper film, which are conductive, to be spaced apart from one another on a first inter-layer insulating film; forming a metal thin film resistor to extend over the first etching stopper film and the second etching stopper film on the first inter-layer insulating film; forming a second inter-layer insulating film on the first inter-layer insulating film to cover the first etching stopper film, the second etching stopper film, and the metal thin film resistor; and forming, by etching, a first contact hole in the second inter-layer insulating film to extend from a surface of the second inter-layer insulating film onto the first etching stopper film by penetrating through the metal thin film resistor, and a second contact hole in the second inter-layer insulating film to extend from a surface of the second inter-layer insulating film onto the second etching stopper film by penetrating through the metal thin film resistor.

With this method, the semiconductor device according to the present disclosure can be manufactured. Further, in this method, the number of processes is reduced, when compared with the conventional method of manufacturing a semiconductor device described above in the section of "BACKGROUND," which leads to shortening a manufacturing time. In addition, when compared with the conventional method of manufacturing a semiconductor device in which masks are required for four processes as described above, the manufacturing method according to the present disclosure requires masks for three processes of forming first and second etching stopper films, forming a metal thin film resistor, and forming first and second contact holes, and thus, costs for manufacturing masks can be reduced.

In one embodiment of the present disclosure, the metal thin film resistor may be formed of TaN or SiCr, and the first etching stopper film and the second etching stopper film may be formed of TiN.

DETAILED DESCRIPTION

Some embodiments of the present disclosure will be described below in detail with reference to the accompanying drawings.

Figure 1A:
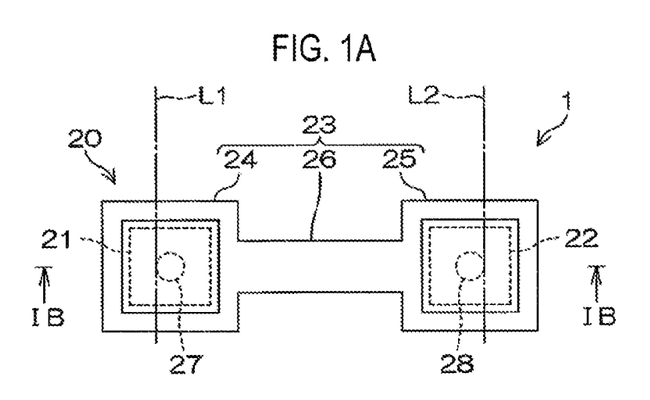
FIG. 1A schematically illustrates a semiconductor device in a plan view, according to a first embodiment of the present disclosure.
Figure 1B:
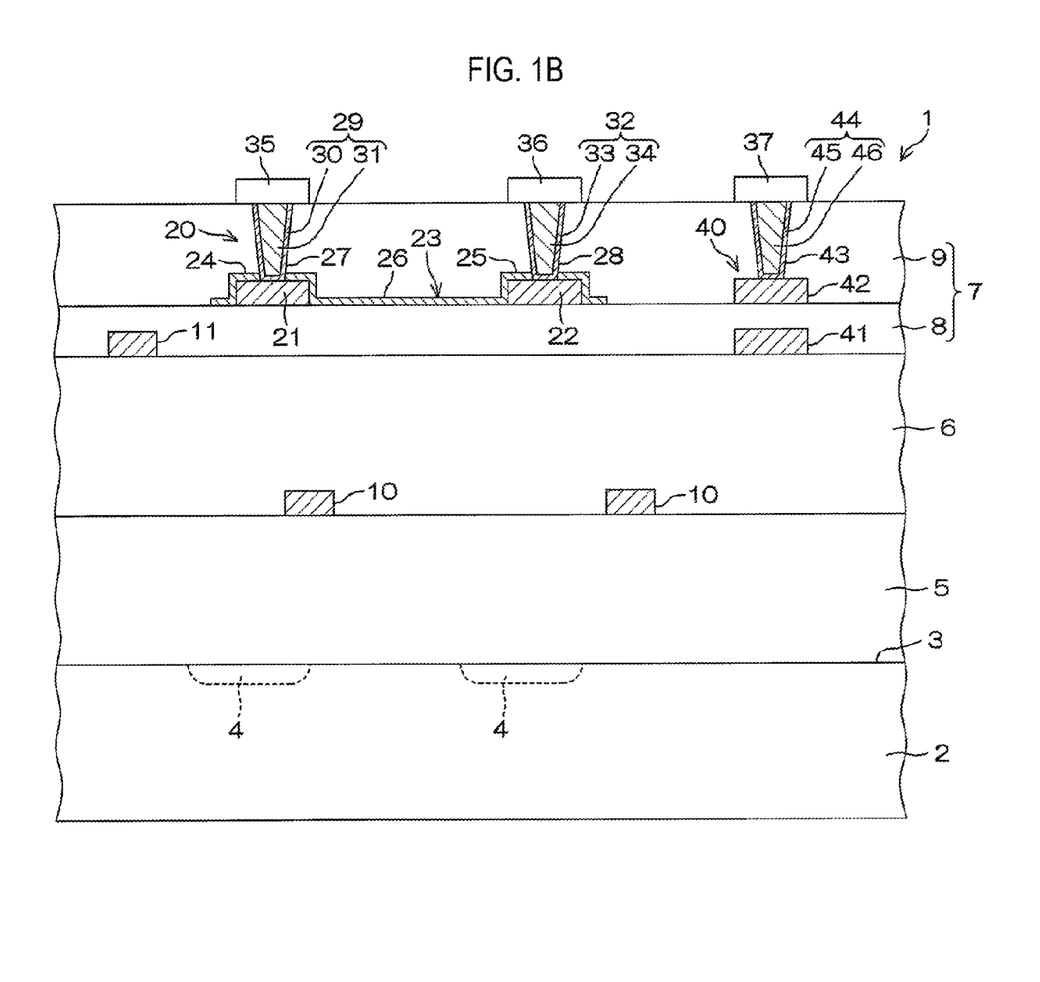
FIG. 1B illustrates a cross-sectional view taken along the line IB-IB of FIG. 1A.

FIG. 1A schematically illustrates a semiconductor device 1 in a plan view, according to a first embodiment of the present disclosure. FIG. 1B illustrates a cross-sectional view taken along the line IB-IB of FIG. 1A. In FIG. 1A, only resistor elements included in the semiconductor device 1 are illustrated while other parts are omitted.

The semiconductor device 1 includes a semiconductor substrate 2 and a plurality of inter-layer insulating films 5 to 7 formed on the semiconductor substrate 2. The semiconductor substrate 2 is formed, for example, with a silicon substrate including semiconductor elements 4, such as an active element and a passive element, formed on a surface 3 of the substrate.

In this embodiment, the plurality of inter-layer insulating films 5 to 7 includes a first inter-layer insulating film 5, a second inter-layer insulating film 6, and a third inter-layer insulating film 7, which are disposed in the above order from the surface 3 of the semiconductor substrate 2. The third inter-layer insulating film 7 includes a lower inter-layer insulating film 8 and an upper inter-layer insulating film 9. The inter-layer insulating films 5 to 7 are formed, for example, of $SiO_2$.

A first wiring layer 10 is formed on the first inter-layer insulating film 5, and a second wiring layer 11 is formed on the second inter-layer insulating film 6. The first wiring layer 10 is coated with the second inter-layer insulating film 6, and the second wiring layer 11 is coated with the lower inter-layer insulating film 8 of the third inter-layer insulating film 7. The wiring layers 10 and 11 are formed, for example, of aluminum (Al).

A resistor element 20 and a capacitor 40 are formed in the third inter-layer insulating film 7. The resistor element 20 includes first and second conductive etching stopper films 21 and 22 that are formed on the lower inter-layer insulating film 8 of the third inter-layer insulating film 7 to be spaced apart from one another in a predetermined direction. The resistor element 20 further includes a metal thin film resistor 23 that is formed on the lower inter-layer insulating film 8 to extend over both the etching stopper films 21 and 22.

In the upper inter-layer insulating film 9, a first contact hole 27 is formed directly on the first etching stopper film 21 to extend from a surface of the upper inter-layer insulating film 9 onto the first etching stopper film 21 by penetrating through the metal thin film resistor 23. Also, in the upper inter-layer insulating film 9, a second contact hole 28 is formed directly on the second etching stopper film 22 to extend from the surface of the upper inter-layer insulating film 9 onto the second etching stopper film 22 by penetrating through the metal thin film resistor 23.

Each of the etching stopper films 21 and 22 has a square shape in the plan view and has two sides that are parallel in the predetermined direction and two other sides that are perpendicular to the predetermined direction. Each of the etching stopper films 21 and 22 has four side surfaces and an upper surface. The upper surface is flat to be almost parallel with the surface of the lower inter-layer insulating film 8. Lower ends of the first and second contact holes 27 and 28 are connected to central portions of upper surfaces of the first and second etching stopper films 21 and 22, respectively. Each of the etching stopper films 21 and 22 is formed of a material having a high conductivity and an etching speed lower than that of the metal thin film resistor 23. In this embodiment, each of the etching stopper films 21 and 22 may be formed of TiN. Specifically, a thickness of each of the etching stopper films 21 and 22 may range from 10 nm to 80 nm. In this embodiment, a thickness of each of the etching stopper films 21 and 22 may be 80 nm.

The metal thin film resistor 23 includes a first portion 24 having a square shape in the plan view and covering the first etching stopper film 21, a second portion 25 having a square shape in the plan view and covering the second etching stopper film 22, and a third portion 26 having a rectangular shape that extends in the predetermined direction in the plan view and connecting the first portion 24 and the second portion 25.

In the plan view, the first portion 24 has four sides that are parallel to the four sides of the first etching stopper film 21, respectively. The first portion 24 covers an entire region of outer surfaces (i.e., the upper surface and the side surfaces) of the first etching stopper film 21, except for a connection portion with the first contact hole 27, and also covers a surrounding region of the first etching stopper film 21 on the surface of the lower inter-layer insulating film 8. As such, the first portion 24 includes a portion formed on the upper surface of the first etching stopper film 21, a portion formed on the side surfaces of the first etching stopper film 21, and a portion formed to have a flange shape in the surrounding region of the first etching stopper film 21 on the surface of the lower inter-layer insulating film 8.

In the plan view, the second portion 25 has four sides that are parallel to the four sides of the second etching stopper film 22, respectively. One (which is close to the first portion 24) of the two sides of the second portion 25 which are parallel in a direction perpendicular to the predetermined direction is arranged to face one (which is close to the second portion 25) of the sides of the first portion 24 which are parallel in the direction perpendicular to the predetermined direction. The second portion 25 covers an entire region of outer surfaces (i.e., the upper surface and the side surfaces) of the second etching stopper film 22, except for a connection portion with the second contact hole 28, and also covers a surrounding region of the second etching stopper film 22 on the surface of the lower inter-layer insulating film 8. As such, the second portion 25 includes a portion formed on the upper surface of the second etching stopper film 22, a portion formed on the side surfaces of the second etching stopper film 22, and a portion formed to have a flange shape in the surrounding region of the second etching stopper film 22 on the surface of the lower inter-layer insulating film 8.

The third portion 26 is formed on the lower inter-layer insulating film 8. In the plan view, one end of the third portion 26 is connected to a widthwise central portion of the side of the first etching stopper film 21, which faces the second etching stopper film 22, and the other end of the third portion 26 is connected to a widthwise central portion of the side of the second etching stopper film 22, which faces the first etching stopper film 21. Also, the third portion 26 has a width smaller than those of the first portion 24 and the second portion 25. Accordingly, the metal thin film resistor 23 as a whole is shaped such that the central third portion 26 is narrower than the first portion 24 and the second portion 25, which are disposed on both ends of the metal thin film resistor 23, in the plan view.

The metal thin film resistor 23 may be formed of TaN. Specifically, a thickness of the metal thin film resistor 23 may range from 2 nm to 10 nm. A resistance value of the resistor element 200 may be controlled by changing the thickness of the metal thin film resistor 23. In this embodiment, the thickness of the metal thin film resistor 23 may be 5 nm. The material of the metal thin film resistor 23 may also be SiCr.

A first contact plug 29 connected to the first etching stopper film 21 is formed in the first contact hole 27. The first contact plug 29 includes a barrier metal film 30 that is formed on an inner surface (i.e., a lower surface and an inner circumferential surface) of the first contact hole 27, and a metal plug 31 that is buried in the first contact hole 27 to be encompassed by the barrier metal film 30. A second contact plug 32 connected to the second etching stopper film 22 is formed in the second contact hole 28. The second contact plug 32 includes a barrier metal film 33 that is formed on an inner surface (i.e., a lower surface and an inner circumferential surface) of the second contact hole 28, and a metal plug 34 that is buried in the second contact hole 28 to be encompassed by the barrier metal film 33. The barrier metal films 30 and 33 are formed, for example, of TiN. The metal plugs 31 and 34 are formed, for example, of tungsten (W).

A wiring 35 connected to the first contact plug 29 and a wiring 36 connected to the second contact plug 32 are formed on the third inter-layer insulating film 7. Also, each of the wirings 35 and 36 is covered with a passivation film (not shown) that is formed on the third inter-layer insulating film 7. A portion of the wirings 35 and 36 may be exposed, for example, as a pad, or the entire wirings 35 and 36 are covered.

The capacitor 40 includes a lower electrode 41 formed on the second inter-layer insulating film 6, an upper electrode 42 formed on the lower inter-layer insulating film 8 of the third inter-layer insulating film 7 to face the lower electrode 41, and an insulating film (the lower inter-layer insulating film 8) interposed between the lower electrode 41 and the upper electrode 42.

The lower electrode 41 is formed of Al which is a material identical to that of the second wiring layer 11 and formed through the same process as the second wiring layer 11. The upper electrode 42 is formed of TiN which is a material identical to those of the etching stopper films 21 and 22 and formed through a process identical to that of the etching stopper films 21 and 22.

In the upper inter-layer insulating film 9, a third contact hole 43 is formed directly on the upper electrode 42 to extend from the surface of the upper inter-layer insulating film 9 onto a central portion of an upper surface of the upper electrode 42. A third contact plug 44 is formed in the third contact hole 43 to be connected to the upper electrode 42. The third contact plug 44 includes a barrier metal film 45 that is formed on an inner surface of the third contact hole 43, and a metal plug 46 that is buried in the contact hole 43 to be encompassed by the barrier metal film 45. The barrier metal film 45 is formed, for example, of TiN. The metal plug 46 is formed, for example, of tungsten (W). A wiring 37 connected to the third contact plug 44 is formed on the third inter-layer insulating film 7.

FIGS. 2A to 2F illustrates cross-sectional views for describing an example of a process of manufacturing the semiconductor device 1 illustrated in FIGS. 1A and 1B. In FIGS. 2A to 2F, illustrations of portions of the semiconductor substrate 2, the first inter-layer insulating film 5, and the second inter-layer insulating film 6 is omitted.

Figure 2A:
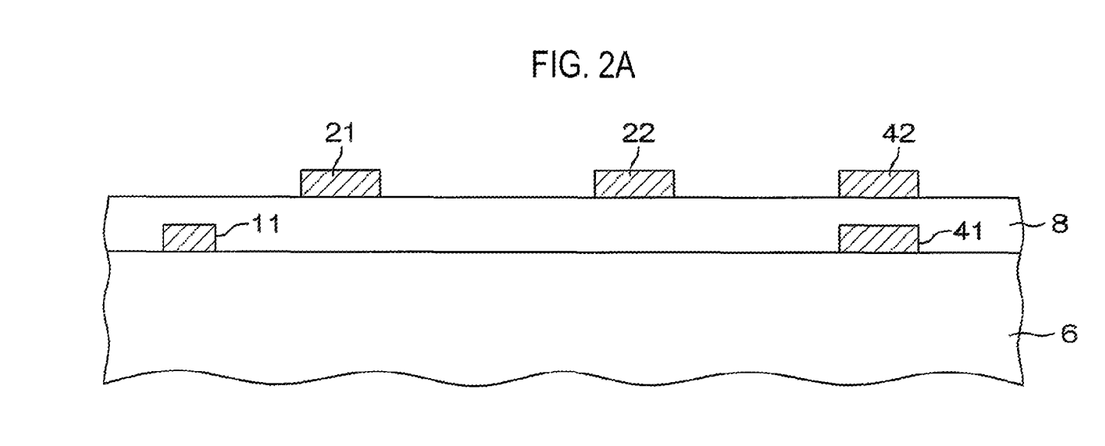
FIG. 2A is a cross-sectional view for describing an example of a process of manufacturing the semiconductor device illustrated in FIGS. 1A and 1B.

In order to manufacture the semiconductor device 1, the semiconductor element 4 is formed on the surface 3 of the semiconductor substrate 2, and the first inter-layer insulating film 5 is then formed on the semiconductor substrate 2. Thereafter, a via (not shown) connected to the semiconductor element 4 is formed in the first inter-layer insulating film 5. Subsequently, the first wiring layer 10 is formed on the first inter-layer insulating film 5.

As illustrated in FIG. 2A, the second inter-layer insulating film 6 is then formed on the first inter-layer insulating film 5 to cover the first wiring layer 10. Thereafter, a via (not shown) connected to the first wiring layer 10 is formed in the second inter-layer insulating film 6. Subsequently, the second wiring layer 11 and the lower electrode 41 of the capacitor 40 are formed on the second inter-layer insulating film 6, and the lower inter-layer insulating film 8 is then formed on the second inter-layer insulating film 6 to cover the second wiring layer 11 and the lower electrode 41. The lower electrode 41 is formed in the same process as the second wiring layer 11.

Thereafter, as illustrated in FIG. 2A, a TiN layer is formed on the lower inter-layer insulating film 8, for example, by using a sputtering method. Subsequently, a resist film is formed in regions on the TiN layer in which the first etching stopper film 21, the second etching stopper film 22, and the upper electrode 42 are to be formed. By etching the TiN layer with the resistor film formed thereon, the first etching stopper film 21, the second etching stopper film 22, and the upper electrode 42 are formed.

Figure 2B:
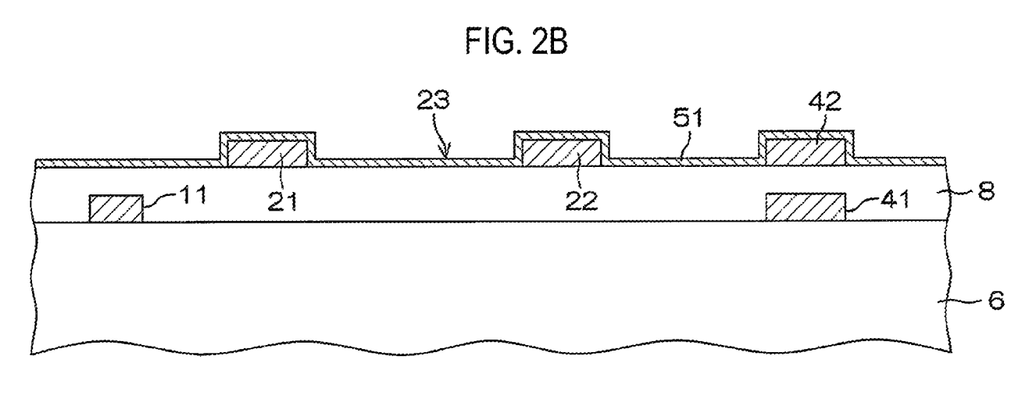
FIG. 2B is a cross-sectional view illustrating a next process of FIG. 2A.
Figure 2C:
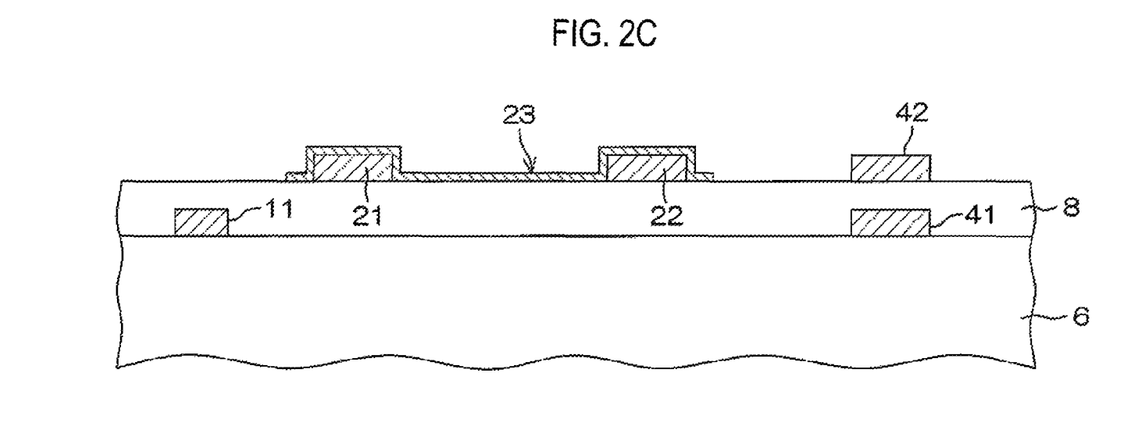
FIG. 2C is a cross-sectional view illustrating a next process of FIG. 2B.

As illustrated in FIG. 2B, a TaN layer 51 is then formed on the lower inter-layer insulating film 8, for example, by using a sputtering method, to cover the first etching stopper film 21, the second etching stopper film 22, and the upper electrode 42. Subsequently, as illustrated in FIG. 2C, the metal thin film resistor 23 is formed by forming a resist film in a region on the TaN layer 51 in which the metal thin film resistor 23 is to be formed and by etching the TaN layer with the resistor film formed thereon.

Figure 2D:
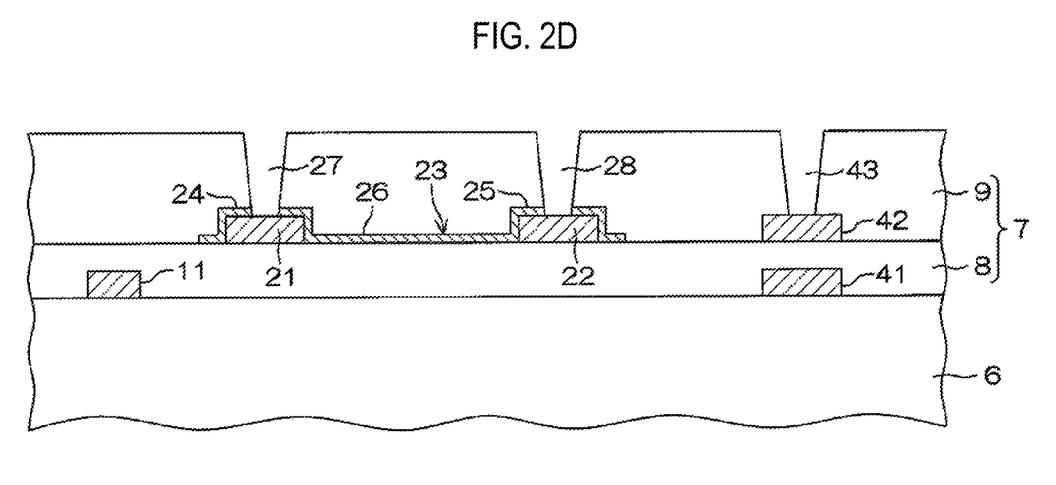
FIG. 2D is a cross-sectional view illustrating a next process of FIG. 2C.

Thereafter, as illustrated in FIG. 2D, the upper inter-layer insulating film 9 is formed on the lower inter-layer insulating film 8 by using a chemical vapor deposition (CVD) method. Subsequently, a resist film is formed in a region on the upper inter-layer insulating film 9 that excludes regions where the first contact hole 27, the second contact hole 28, and the third contact hole 43 are to be formed. By etching the upper inter-layer insulating film 9 with the resist film thereon, the first contact hole 27, the second contact hole 28, and the third contact hole 43 are formed. A lower end portion of the first contact hole 27 extends onto the first etching stopper film 21 by penetrating through the metal thin film resistor 23. A lower end portion of the second contact hole 28 extends onto the second etching stopper film 22 by penetrating through the metal thin film resistor 23. A lower end portion of the third contact hole 43 extends onto the upper electrode 42.

Figure 2E:
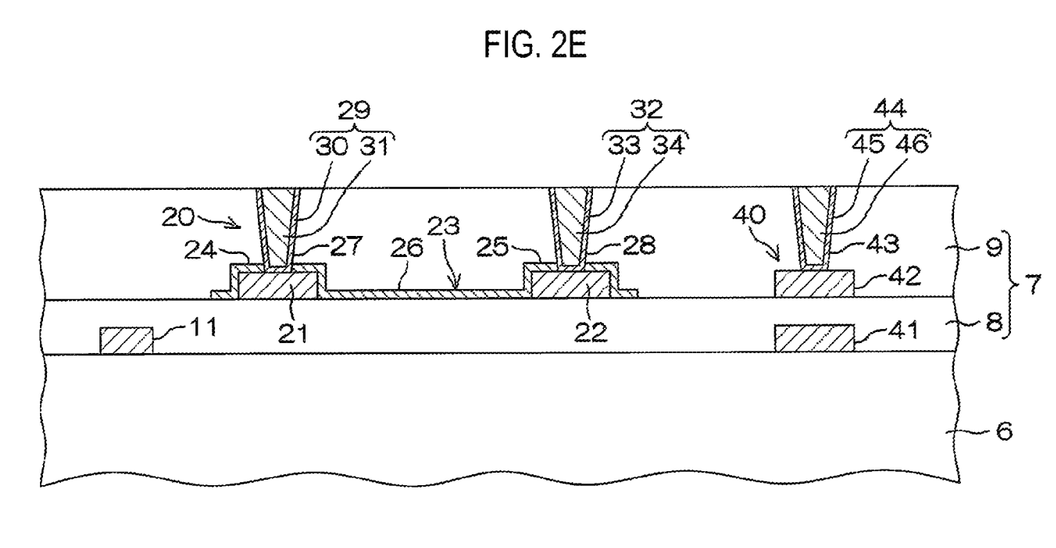
FIG. 2E is a cross-sectional view illustrating a next process of FIG. 2D.

As illustrated in FIG. 2E, the barrier metal films 30, 33, and 45 of Ti are then formed on inner surfaces of the first to third contact holes 27, 28, and 43, respectively, for example, by using a sputtering method. Subsequently, the metal plugs 31, 34, and 46 of tungsten (W) are buried, by using a CVD method, in the first to third contact holes 27, 28, and 43 with the barrier metal films 30, 33, and 45 formed on the inner surfaces thereof. Accordingly, the first to third contact plugs 29, 32, and 44 are formed in the first to third contact holes 27, 28, and 43, respectively.

Figure 2F:
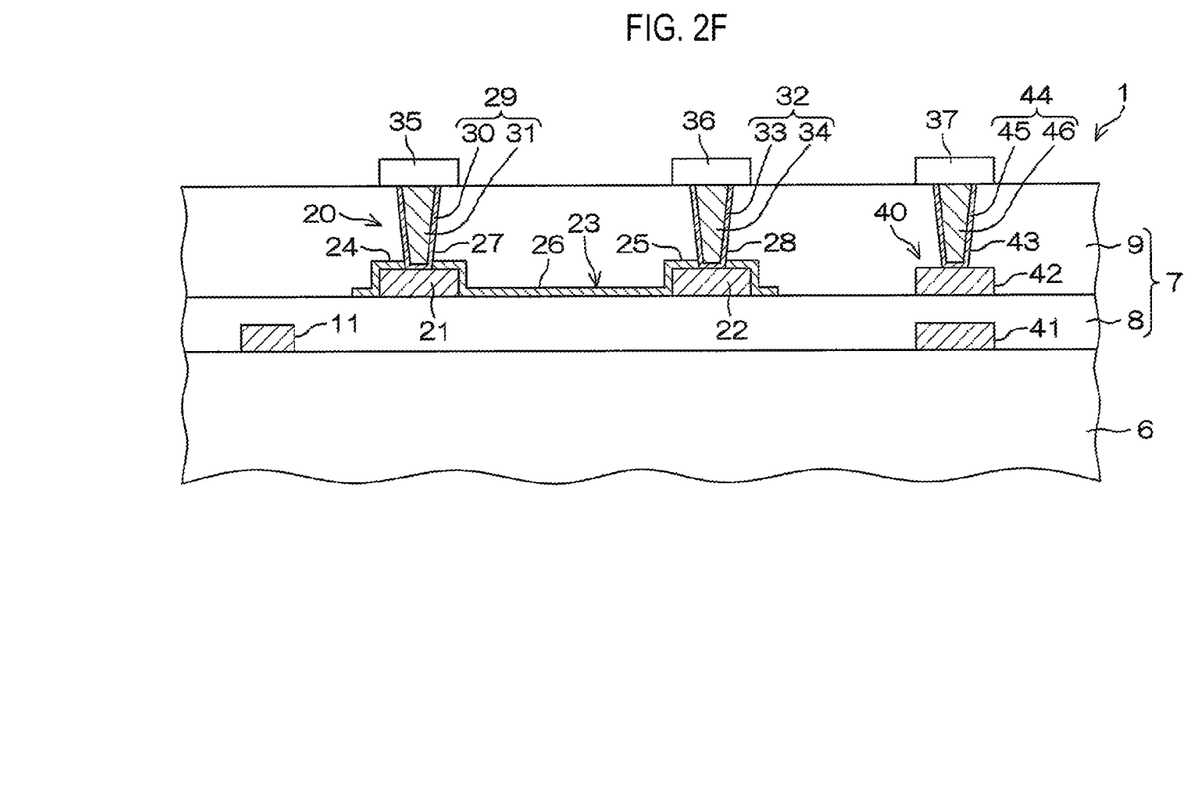
FIG. 2F is a cross-sectional view illustrating a next process of FIG. 2E.

Thereafter, as illustrated in FIG. 2F, the wirings 35, 36, and 37 connected to the first to third contact plugs 29, 32, and 44, respectively, are formed on the upper inter-layer insulating film 9. As such, the semiconductor device 1 illustrated in FIGS. 1A and 1B is obtained.

In the semiconductor device 1 according to this embodiment, the first and second etching stopper films 21 and 22 are interposed between the lower inter-layer insulating film 8 and the portions in the metal thin film resistor 23 at which the first and second contact holes 27 and 28 are formed. Thus, when the first and second contact holes 27 and 28 extending from the surface of the upper inter-layer insulating film 9 onto the first and second etching stopper films 21 and 22 by penetrating through the metal thin film resistor 23 are formed in the upper inter-layer insulating film 9, the contact holes 27 and 28 can be prevented from reaching the lower inter-layer insulating film 8. Thus, it can be prevented for the metal thin film resistor 23 to be connected to the wiring positioned below the metal thin film resistor 23.

Further, in the semiconductor device 1 according to this embodiment, manufacturing time can be shortened and costs for manufacturing masks can be reduced, compared with the conventional semiconductor device (hereinafter, referred to as "Comparative Example") described above in the section of "BACKGROUND." This will be described below.

In the Comparative Example, in order to form resistor elements and contact holes, a total of seven processes of (a1) forming a layer of a material for a metal thin film resistor (i.e., thin film resistor layer), (a2) forming a first insulating layer (a3) forming a thin contact hole, (a4) forming a layer of a material for etching stopper films (i.e., conductor layer), (a5) patterning the layer of the material for the metal thin film resistor, (a6) separating the layer of the material for the etching stopper films, and (a7) forming a second insulating layer and deep contact holes are required, as described above.

In contrast, in the semiconductor device 1 according to the embodiment, five processes of (b1) forming a layer of a material for the etching stopper films (see FIG. 2A), (b2) patterning the layer of the material for the etching stopper films (see FIG. 2A), (b3) forming a layer of a material for a metal thin film resistor (see FIG. 2B), (b4) patterning the layer of the material for the metal thin film resistor (see FIG. 2C), and (b5) forming an upper inter-layer insulating film and contact holes (see FIG. 2D) are performed. Thus, in the semiconductor device 1 according to the embodiment, manufacturing time can be shortened, compared with the Comparative Example.

Further, in the Comparative Example, masks are required for the four processes of (a3), (a5), (a6), and (a7). In contrast, in the semiconductor device 1 according to the embodiment, masks are required for the three processes (b2), (b4), and (b5), and thus, the cost for manufacturing masks can be reduced, compared with the Comparative Example.

Also, in the process (i.e., process (a3)) of the Comparative Example for forming the two thin contact holes spaced apart from one another to extend from the surface of the first insulating film to the surface of the thin film resistor layer in the first insulating film, the surface of the thin film resistor layer may be easily damaged during etching. For this reason, a bonding state in the interface between the metal thin film resistor and the etching stopper film may not be good. In contrast, in the semiconductor device 1 according to the embodiment, the side surface of the etching stopper film in which a contact area of the metal thin film resistor is large is less damaged during etching and formed to be smooth, and thus, a bonding state in the interface between the metal thin film resistor and the etching stopper film is good.

Figure 3A:
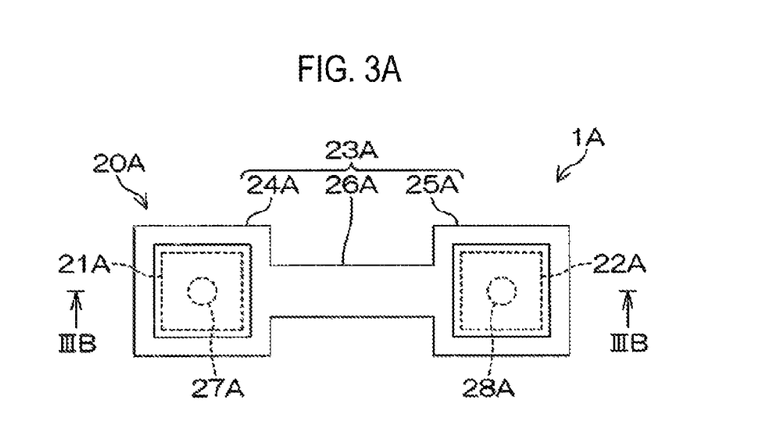
FIG. 3A schematic illustrates a semiconductor device in a plan view, according to a second embodiment of the present disclosure.
Figure 3B:
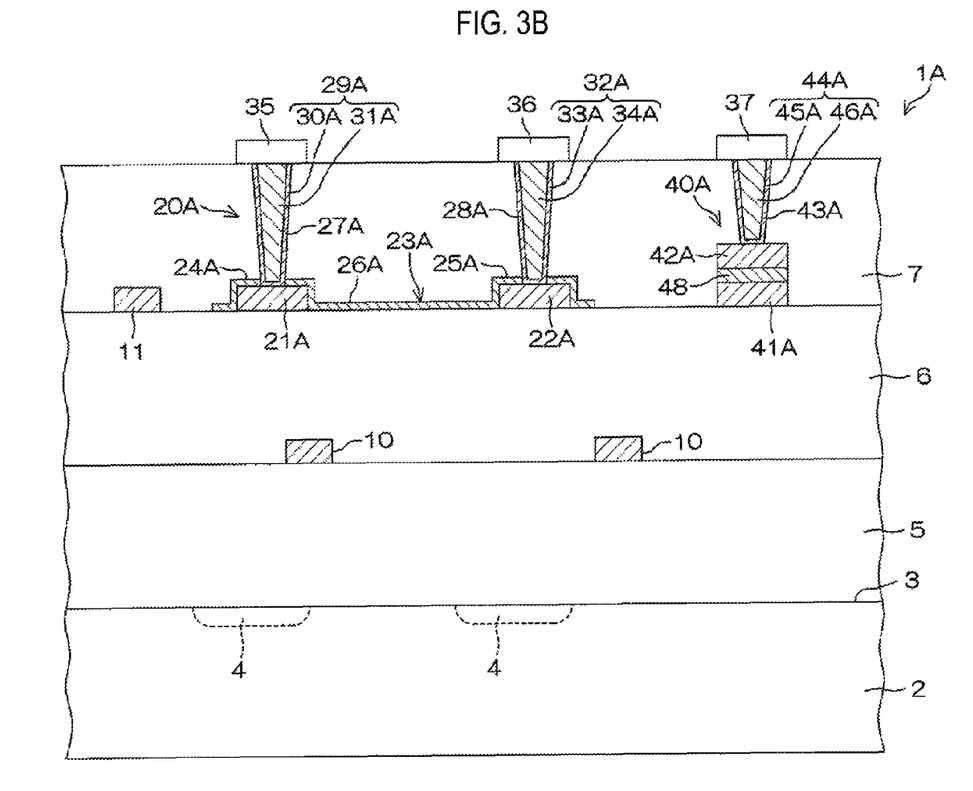
FIG. 3B illustrates a cross-sectional view taken along the line IIIB-IIIB of FIG. 3A.

FIG. 3A schematically illustrates a semiconductor device 1A in a plan view, according to a second embodiment of the present disclosure. FIG. 3B illustrates a cross-sectional view taken along the line IIIB-IIIB of FIG. 3A. In FIG. 3A, only resistor elements included in the semiconductor device 1A are illustrated and illustration of other parts is omitted. In FIGS. 3A and 3B, the same reference numerals are used for the components corresponding to those of FIGS. 1A and 1B.

The semiconductor device 1A includes a semiconductor substrate 2 and a plurality of inter-layer insulating films 5 to 7 formed on the semiconductor substrate 2. The semiconductor substrate 2 is formed, for example, with a silicon substrate including semiconductor elements 4, such as an active element and a passive element, formed on a surface 3 of the substrate.

In this embodiment, the plurality of inter-layer insulating films 5 to 7 includes a first inter-layer insulating film 5, a second inter-layer insulating film 6, and a third inter-layer insulating film 7, which are disposed in the above order from the surface 3 of the semiconductor substrate 2. A first wiring layer 10 is formed on the first inter-layer insulating film 5, and a second wiring layer 11 is formed on the second inter-layer insulating film 6. The first wiring layer 10 is coated with the second inter-layer insulating film 6, and the second wiring layer 11 is coated with the third inter-layer insulating film 7. The wiring layers 10 and 11 are formed, for example, of aluminum (Al).

A resistor element 20A and a capacitor 40A are formed within the third inter-layer insulating film 7. The resistor element 20A includes first and second conductive etching stopper films 21A and 22A that are formed on the second inter-layer insulating film 6 to be spaced apart from one another in a predetermined direction. The resistor element 20A further includes a metal thin film resistor 23A that is formed on the second inter-layer insulating film 6 to extend over both the etching stopper films 21A and 22A.

In the third inter-layer insulating film 7, a first contact hole 27A is formed directly on the first etching stopper film 21A to extend from a surface of the third inter-layer insulating film 7 onto the first etching stopper film 21A by penetrating through the metal thin film resistor 23A. Also, in the third inter-layer insulating film 7, a second contact hole 28A is formed directly on the second etching stopper film 22A to extend from the surface of the third inter-layer insulating film 7 onto the second etching stopper film 22A by penetrating through the metal thin film resistor 23A.

Each of the etching stopper films 21A and 22A has a square shape in the plan view and has two sides that are parallel in the predetermined direction and two other sides that are perpendicular to the predetermined direction. Each of the etching stopper films 21A and 22A has four side surfaces and an upper surface. The upper surface is flat to be almost parallel to the surface of the second inter-layer insulating film 6. Lower ends of the first and second contact holes 27A and 28A are connected to central portions of upper surfaces of the first and second etching stopper films 21A and 22A, respectively. Each of the etching stopper films 21A and 22A is formed of a material having a high conductivity and an etching speed lower than that of the metal thin film resistor 23A. In this embodiment, each of the etching stopper films 21A and 22A may be formed of aluminum (Al) which is a material identical to that of the second wiring layer 11, and formed in the same process as the second wiring layer 11. Specifically, a thickness of each of the etching stopper films 21A and 22A may range from 300 nm to 350 nm. In this embodiment, a thickness of each of the etching stopper films 21A and 22A may be 320 nm.

The metal thin film resistor 23A includes a first portion 24A having a square shape in the plan view and covering the first etching stopper film 21A, a second portion 25A having a square shape in the plan view and covering the second etching stopper film 22A, and a third portion 26A having a rectangular shape that extends in the predetermined direction in the plan view and connecting the first portion 24A and the second portion 25A.

In the plan view, the first portion 24A has four sides that are parallel to the four sides of the first etching stopper film 21A, respectively. The first portion 24A covers an entire region of outer surfaces (i.e., the upper surface and the side surfaces) of the first etching stopper film 21A, except for a connection portion with the first contact hole 27A, and also covers a surrounding region of the first etching stopper film 21A on the surface of the second inter-layer insulating film 6. As such, the first portion 24A includes a portion formed on the upper surface of the first etching stopper film 21A, a portion on the side surfaces of the first etching stopper film 21A, and a portion formed to have a flange shape in the surrounding region of the first etching stopper film 21A on the surface of the second inter-layer insulating film 6.

In the plan view, the second portion 25A has four sides that are parallel to the four sides of the second etching stopper film 22A, respectively. One (which is close to the first portion 24A) of the two sides of the second portion 25A which are parallel in a direction perpendicular to the predetermined direction is arranged to face one (which is close to the second portion 25A) of the two sides of the first portion 24A which are parallel in the direction perpendicular to the predetermined direction. The second portion 25A covers an entire region of outer surfaces (i.e., the upper surface and the side surfaces) of the second etching stopper film 22A, except for a connection portion with the second contact hole 28A, and also covers a surrounding region of the second etching stopper film 22A on the surface of the second inter-layer insulating film 6. As such, the second portion 25A includes a portion formed on the upper surface of the second etching stopper film 22A, a portion formed on the side surfaces of the second etching stopper film 22A, and a portion formed to have a flange shape in the surrounding region of the second etching stopper film 22A on the surface of the second inter-layer insulating film 6.

The third portion 26A is formed on the second inter-layer insulating film 6. In the plan view, one end of the third portion 26A is connected to a widthwise central portion of the side of the first etching stopper film 21A, which faces the second etching stopper film 22A, and the other end is connected to a widthwise central portion of the side of the second etching stopper film 22A, which faces the first etching stopper film 21A. Also, the third portion 26A has a width smaller than those of the first portion 24A and the second portion 25A. Accordingly, the metal thin film resistor 23A as a whole is shaped such that the central third portion 26A is narrower than the first portion 24A and the second portion 25A, which are disposed on both ends of the metal thin film resistor 23A, in the plan view.

The metal thin film resistor 23A may be formed of TaN. Specifically, a thickness of the metal thin film resistor 23A may range from 2 nm to 10 nm. In this embodiment, the thickness of the metal thin film resistor 23A may be 5 nm. The material of the metal thin film resistor 23A may be SiCr.

A first contact plug 29A connected to the first etching stopper film 21A is formed in the first contact hole 27A. The first contact plug 29A includes a barrier metal film 30A that is formed on an inner surface (i.e., a lower surface and an inner circumferential surface) of the first contact hole 27A, and a metal plug 31A that is buried in the first contact hole 27A to be encompassed by the barrier metal film 30A. A second contact plug 32A connected to the second etching stopper film 22A is formed in the second contact hole 28A. The second contact plug 32A includes a bather metal film 33A that is formed on an inner surface (i.e., a lower surface and an inner circumferential surface) of the second contact hole 28A, and a metal plug 34A that is buried in the second contact hole 28A to be encompassed by the barrier metal film 33A. The barrier metal films 30A and 33A are formed, for example, of TiN. The metal plugs 31A and 34A are formed, for example, of tungsten (W).

A wiring 35 connected to the first contact plug 29A and a wiring 36 connected to the second contact plug 32A are formed on the third inter-layer insulating film 7.

The capacitor 40A includes a lower electrode 41A formed on the second inter-layer insulating film 6, an insulating film 48 formed on the lower electrode 41A, and an upper electrode 42A formed on the insulating film 48. The lower electrode 41A is formed of Al which is a material identical to that of the second wiring layer 11 and formed through in the same process as the second wiring layer 11. The insulating film 48 is formed of $SiO_2$. The upper electrode 42A is formed of Al.

In the third inter-layer insulating film 7, a third contact hole 43A is formed directly on the upper electrode 42A to extend from the surface of the third inter-layer insulating film 7 onto a central portion of an upper surface of the upper electrode 42. A third contact plug 44A connected to the upper electrode 42A is formed in the third contact hole 43A. The third contact plug 44A includes a barrier metal film 45A that is formed on an inner surface of the third contact hole 43A, and a metal plug 46A that is buried in the contact hole 43A to be encompassed by the barrier metal film 45A. The barrier metal film 45A is formed, for example, of TiN. The metal plug 46A is formed, for example, of tungsten (W). A wiring 37 connected to the third contact plug 44A is formed on the third inter-layer insulating film 7.

The embodiments of the present disclosure have been described above, but the present disclosure may also be implemented in any other forms additionally. For example, in the first embodiment as described above, the first portion 24 and the second portion 25 of the metal thin film resistor 23 cover the entire region of the outer surfaces of the first and second etching stopper films 21 and 22, except for the connection portions with the contact holes 27 and 28. However, the first portion 24 and the second portion 25 of the metal thin film resistor 23 may cover regions, starting from the facing sides of the upper surfaces of the first and second etching stopper films 21 and 22 to the region of the outer sides of the portions where the contact holes 27 and 28 are formed (except for the connection portions with the contact holes 27 and 28). For example, the outer portion of the contact hole 27 (i.e., the outer portion of the dashed and dotted line L1 of FIG. 1) in the first portion 24 of the metal thin film resistor 23 and the outer portion of the contact hole 28 (i.e., the outer portion of the chain line L2 of FIG. 1) in the second portion 25 of the metal thin film resistor 23 may be eliminated. This may also apply to the second embodiment. However, to increase the contact area between the metal thin film resistor 23 and the etching stopper films 21 and 22, the first portion 24 and the second portion 25 of the metal thin film resistor 23 may cover almost all the regions of the outer surfaces of the first and second etching stopper films 21 and 22, as in the first embodiment.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
   a first inter-layer insulating film;
   a wiring disposed below or inside the first inter-layer insulating film;
   a first etching stopper film and a second etching stopper film that are conductive and formed to be spaced apart from one another on and above the first inter-layer insulating film;
   a metal thin film resistor formed to extend over the first etching stopper film and the second etching stopper film on the first inter-layer insulating film so that the metal thin film resistor is in direct contact with the first inter-layer insulating film;
   a second inter-layer insulating film formed on the first inter-layer insulating film to cover the first and second etching stopper films and the metal thin film resistor;
   a first contact hole formed in the second inter-layer insulating film to extend from a surface of the second inter-layer insulating film onto the first etching stopper film by penetrating through the metal thin film resistor; and
   a second contact hole formed in the second inter-layer insulating film to extend from the surface of the second inter-layer insulating film onto the second etching stopper film by penetrating through the metal thin film resistor,
   wherein the first etching stopper film and the second etching stopper film are made of a material different from that of the wiring.

2. The semiconductor device of claim 1, wherein the metal thin film resistor comprises:
   a first portion configured to cover an entire region of outer surfaces of the first etching stopper film, except for a connection portion with the first contact hole, and a surrounding region of the first etching stopper film on a surface of the first inter-layer insulating film;
   a second portion configured to cover an entire region of outer surfaces of the second etching stopper film, except for a connection portion with the second contact hole, and a surrounding region of the second etching stopper film on the surface of the first inter-layer insulating film; and
   a third portion configured to connect the first portion and the second portion.

3. The semiconductor device of claim 2, wherein the outer surfaces of the first etching stopper film comprise side surfaces and an upper surface of the first etching stopper film, and wherein the outer surfaces of the second etching stopper film comprise side surfaces and an upper surface of the second etching stopper film.

4. The semiconductor device of claim 1, further comprising:

a first contact plug formed in the first contact hole and connected to the first etching stopper film; and a second contact plug formed in the second contact hole and connected to the second etching stopper film.

5. The semiconductor device of claim 1, wherein the metal thin film resistor is formed of TaN or SiCr.

6. The semiconductor device of claim 1, wherein the first etching stopper film and the second etching stopper film are formed of TiN.

7. The semiconductor device of claim 1, wherein a thickness of the metal thin film resistor ranges from 2 nm to 10 nm.

8. The semiconductor device of claim 1, wherein a thickness of each of the first etching stopper film and the second etching stopper film ranges from 10 nm to 80 nm.

9. The semiconductor device of claim 1, further comprising:

a third inter-layer insulating film disposed below the first inter-layer insulating film; and a capacitor including
  a lower electrode formed on the third inter-layer insulating film, and
  an upper electrode formed on the first inter-layer insulating film to face the lower electrode, wherein the upper electrode is formed in a process for forming the first and second etching stopper films.

10. A method of manufacturing a semiconductor device, comprising:

a first inter-layer insulating film;

a wiring disposed below or inside the first inter-layer insulating film;

forming a first etching stopper film and a second etching stopper film, which are conductive, to be spaced apart from one another on and above the first inter-layer insulating film;

forming a metal thin film resistor to extend over the first etching stopper film and the second etching stopper film on the first inter-layer insulating film so that the metal thin film resistor is in direct contact with the first inter-layer insulating film;

forming a second inter-layer insulating film on the first inter-layer insulating film to cover the first etching stopper film, the second etching stopper film, and the metal thin film resistor; and forming, by etching,
  a first contact hole in the second inter-layer insulating film to extend from a surface of the second inter-layer insulating film onto the first etching stopper film by penetrating through the metal thin film resistor, and
  a second contact hole in the second inter-layer insulating film to extend from the surface of the second inter-layer insulating film onto the second etching stopper film by penetrating through the metal thin film resistor, wherein the first etching stopper film and the second etching stopper film are made of a material different from that of the wiring.

11. The method of claim 10, wherein the metal thin film resistor is formed of TaN or SiCr, and the first etching stopper film and the second etching stopper film are formed of TiN.

* * * * *